(12) United States Patent
Kotani

(10) Patent No.: US 6,674,127 B2
(45) Date of Patent: Jan. 6, 2004

(54) SEMICONDUCTOR INTEGRATED CIRCUIT

(75) Inventor: Naoki Kotani, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/840,882

(22) Filed: Apr. 25, 2001

(65) Prior Publication Data

US 2001/0035774 A1 Nov. 1, 2001

(30) Foreign Application Priority Data

Apr. 27, 2000 (JP) .......................... 2000-127474
Aug. 11, 2000 (JP) .......................... 2000-243716

(51) Int. Cl.$^7$ .............................................. H01L 27/01
(52) U.S. Cl. .................. 257/347; 257/347; 257/348; 257/349; 257/350; 257/351; 257/357; 326/120
(58) Field of Search ................... 257/347, 348, 257/349, 350, 351, 357; 326/120

(56) References Cited

U.S. PATENT DOCUMENTS

| | | | | |
|---|---|---|---|---|
| 5,341,028 A | * | 8/1994 | Yamaguchi et al. | 257/344 |
| 5,359,219 A | * | 10/1994 | Hwang | 257/351 |
| 5,430,403 A | * | 7/1995 | Moyer et al. | 327/365 |
| 5,591,650 A | * | 1/1997 | Hsu et al. | 437/21 |
| 5,744,994 A | * | 4/1998 | Williams | 327/374 |
| 5,804,858 A | * | 9/1998 | Hsu et al. | 257/347 |
| 5,917,218 A | * | 6/1999 | Choi et al. | 257/345 |
| 6,111,427 A | * | 8/2000 | Fujii et al. | 326/34 |
| 6,278,157 B1 | * | 8/2001 | Tran et al. | 257/347 |
| 6,297,529 B1 | * | 10/2001 | Imai | 257/318 |
| 6,306,709 B1 | * | 10/2001 | Miyagi et al. | 438/276 |

FOREIGN PATENT DOCUMENTS

| | | |
|---|---|---|
| JP | 06029834 A | 2/1994 |
| JP | 08204140 A | 8/1996 |
| JP | 08-228145 | 9/1996 |
| JP | 10135814 A | 5/1998 |

* cited by examiner

*Primary Examiner*—Eddie Lee
*Assistant Examiner*—Edgardo Ortiz
(74) *Attorney, Agent, or Firm*—Nixon Peabody LLP; Donald R. Studebaker

(57) ABSTRACT

A semiconductor integrated circuit includes: a logic circuit section including transistors formed on an SOI substrate; and a partially-depletion-type transistor, which is formed on the SOI substrate as a switching transistor for controlling ON/OFF states of the logic circuit section and which has a body contact portion. The partially-depletion-type transistor has a threshold voltage, which is substantially equal to that of the transistors in the logic circuit section when no potential is applied to the body contact portion and which is higher than that of the transistors in the logic circuit section when a potential is applied to the body contact portion.

9 Claims, 7 Drawing Sheets

SEMICONDUCTOR INTEGRATED CIRCUIT

BACKGROUND OF THE INVENTION

The present invention relates to a semiconductor integrated circuit including an SOI substrate, and more particularly relates to a semiconductor integrated circuit including an MOS transistor with a body contact portion.

Recently, a semiconductor integrated circuit, including a logic circuit made up of MOS transistors, has been downsized, so that high-speed operation and low-power consumption have been advanced rapidly. However, as the circuit has been downsized to increase its operating speed, an increased amount of leakage current flows through the MOS transistors, which is contrary to the demand for low-power consumption. Under the circumstances such as these, a trade-off between high-speed operation and low-power consumption becomes more and more inevitable, thus making this problem more and more difficult to solve.

An MTCMOS (multi-threshold CMOS) circuit as shown in FIG. 6 is one of known means for realizing high-speed operation and low-power consumption.

As illustrated in FIG. 6, a known MTCMOS circuit includes: a logic circuit section 160 including low-threshold-voltage transistors 151; a power line 161 for supplying a supply potential VDD; an internal power line 162 for supplying an internal supply potential VD1 to the logic circuit section 160 via a high-threshold-voltage transistor 152; and a ground line 163 for supplying a ground potential Vss to the logic circuit section 160.

The MTCMOS circuit with this structure realizes high-speed operation by operating the relatively small low-threshold-voltage transistors 151 only when the circuit is powered. On the other hand, when the circuit is in standby mode, the high-threshold-voltage transistor 152 is turned OFF to reduce a standby-mode current and eventually the power dissipated. In this manner, the known MTCMOS circuit realizes high-speed operation by taking advantage of the low-threshold-voltage transistors 151 and, at the same time, removes the drawback, i.e., the increase of the leakage current, by using the high-threshold-voltage transistor 152.

FIG. 7A illustrates a cross-sectional structure for the low-threshold-voltage transistor 151. FIG. 7B illustrates a cross-sectional structure for the high-threshold-voltage transistor 152.

As shown in FIG. 7A, the low-threshold-voltage transistor 151 is formed on an n-well 201a. The n-well 201a is electrically isolated by a shallow trench isolation region (which will be herein referred to as an "STI region") 202 in a semiconductor substrate 201 of silicon. A gate electrode 203 is formed on the n-well 201a and source/drain regions 204 and 205 are defined in the n-well 201a to be spaced apart from each other in the gate length direction. A channel region is formed in part of the n-well 201a under the gate electrode 203 and is defined by a low-threshold-voltage-setting doped layer 206. Lower parts of the n-well 201a and contact-portion well 201b are in contact with each other. A potential at the contact-portion well 201b is controllable using a substrate contact electrode 207.

As shown in FIG. 7B, the high-threshold-voltage transistor 152 is formed on an n-well 201c. The n-well 201c is electrically isolated by an STI region 202 in the semiconductor substrate 201. A gate electrode 213 is formed on the n-well 201c and source/drain regions 214 and 215 are defined in the n-well 201c to be spaced apart from each other in the gate length direction. The channel region is formed in part of the n-well 201c under the gate electrode 213 and is defined by a high-threshold-voltage-setting doped layer 216. Lower parts of the n-well 201c and contact-portion well 201d are in contact with each other. A potential at the contact-portion well 201d is controllable using a substrate contact electrode 217.

However, the known MTCMOS circuit needs to include two types of transistors having mutually different threshold voltages, i.e., the low-threshold-voltage transistors 151 and high-threshold-voltage transistor 152. Accordingly, when the low- and high-threshold-voltage-setting doped layers 206 and 216 are formed, for example, it is necessary to form masks separately for these two types of transistors in implanting dopants. Thus, fabricating cost rises.

Moreover, to further increase the operating speed, an MTCMOS circuit using an SOI substrate has been researched and developed. However, since an SOI substrate is more expensive than a silicon substrate, the fabricating cost further rises when an SOI substrate is used.

Since the high-threshold-voltage transistor 152 has higher resistance than that of the low-threshold-voltage transistor 151 during the operation, a voltage drop is likely to occur. As a result, the internal supply potential VD1, which is a supply potential for the logic circuit section 160, unintentionally becomes lower than the supply potential VDD. Thus, the low-threshold-voltage transistors 151 in the logic circuit section 160 have their operating speed decreased unfavorably.

SUMMARY OF THE INVENTION

It is therefore an object of the present invention to form transistors having mutually different threshold voltages through a single ion implantation process and thereby realize high-speed operation and low power consumption.

To achieve this object, a semiconductor integrated circuit according to the present invention includes: a logic circuit section; and a switching transistor for controlling the operation of the logic circuit section. The logic circuit section and the switching transistor are both formed on the same SOI substrate. Also, the switching transistor is implemented as a partially-depletion-type MOS transistor having a body contact portion. In this case, a threshold-voltage-setting doped layer with the same dopant concentration is formed for both the switching transistor and transistors in the logic circuit section by performing a single ion implantation process. The body contact portion herein means a region for fixing a potential level at the active region of the transistor.

In the inventive switching transistor, when the body contact portion is allowed to be electrically floating, the threshold voltage of the switching transistor becomes substantially equal to that of the transistors in the logic circuit section. But when a predetermined voltage is applied to the body contact portion, the threshold voltage of the switching transistor increases its absolute value. In this case, the transistors in the logic circuit section may have no body contact portion. Alternatively, even if those transistors do have the body contact portions, the contact portions are made electrically floating. Thus, even if those transistors have the same dopant concentration at their channel regions, the switching transistor has a relatively high threshold voltage, whereas the transistors in the logic circuit section have a threshold voltage lower than that of the switching transistor.

Accordingly, even though the threshold-voltage-setting doped layer is formed through a single ion implantation process, the switching transistor can be implemented as a partially-depletion-type transistor with the body contact portion and can have its threshold voltage increased or decreased selectively by applying a predetermined voltage to the body contact portion.

Specifically, a first inventive semiconductor integrated circuit includes: a logic circuit section including transistors formed on an SOI substrate; and a partially-depletion-type transistor, which is formed on the SOI substrate as a switching transistor for controlling ON/OFF states of the logic circuit section and which has a body contact portion. The partially-depletion-type transistor has a threshold voltage, which is substantially equal to that of the transistors in the logic circuit section when no potential is applied to the body contact portion and which is higher than that of the transistors in the logic circuit section when a potential is applied to the body contact portion.

In the first inventive circuit, the partially-depletion-type transistor has a threshold voltage, which is substantially equal to that of the transistors in the logic circuit section when no potential is applied to the body contact portion and which is higher than that of the transistors in the logic circuit section when a potential is applied to the body contact portion. Thus, in fabricating the semiconductor integrated circuit, the threshold-voltage-setting doped layer of the switching transistor and transistors in the logic circuit section can be formed in a single ion implantation process. As a result, the fabricating cost can be reduced. Moreover, in operating the semiconductor integrated circuit, when a potential is applied to the body contact portion of the switching transistor, the switching transistor gains a higher threshold voltage than that of the transistors of the logic circuit section. Accordingly, for example, if an MTCMOS circuit is formed using these transistors, high-speed operation and low power consumption are both realized.

A second inventive semiconductor integrated circuit includes: a logic circuit section including transistors formed on an SOI substrate; a partially-depletion-type transistor, which is formed on the SOI substrate as a switching transistor for controlling ON/OFF states of the logic circuit section and which has a body contact portion; and power supply means for applying a predetermined potential to the body contact portion. The partially-depletion-type transistor has a threshold voltage, which is substantially equal to that of the transistors in the logic circuit section when no potential is applied to the body contact portion by the power supply means and which is higher than that of the transistors in the logic circuit section when a potential is applied to the body contact portion by the power supply means. The power supply means supplies a predetermined potential to the body contact portion when the logic circuit section is in standby mode and allows the body contact portion to be electrically floating when the logic circuit section is operating.

The second inventive circuit attains the same advantages as those of the first inventive circuit. Moreover, the power supply means applies a predetermined potential to the body contact portion when the logic circuit section is in standby mode. Then, the switching transistor gains a high threshold voltage, thereby reducing the leakage current of the transistors in the logic circuit section. Since the power supply means allows the body contact portion to be electrically floating when the logic circuit section is operating, the switching transistor comes to have a low threshold voltage. As a result, the switching transistor will not cause a voltage drop and the operation speed of the logic circuit section will not decrease, either.

In one embodiment of the present invention, the partially-depletion-type transistor preferably includes: an active region formed in the SOI substrate; and a gate electrode formed to overlap the active region. The body contact portion is preferably formed in an extended region that has been formed by extending part of the active region under the gate electrode along the width of the gate electrode. Then, the body contact portion can be formed in a minimum area without causing any variation in characteristics of the transistors, especially in the threshold voltages.

BRIEF DESCRIPTION OF THE DRAWINGS

FIG. 4A illustrates part of the circuit; and FIG. 4B is a cross-sectional view illustrating an MOSFET for the semiconductor integrated circuit.

FIG. 5A illustrates part of the circuit; and FIG. 5B is a cross-sectional view illustrating an MOSFET for the semiconductor integrated circuit.

FIG. 7A is a cross-sectional view illustrating a low-threshold-voltage transistor for the circuit; and FIG. 7B is a cross-sectional view illustrating a high-threshold-voltage transistor for the integrated circuit.

DESCRIPTION OF THE PREFERRED EMBODIMENTS

In a partially-depletion-type MOS transistor (MOSFET) formed on an SOI substrate to have a body contact portion, when a predetermined potential such as ground potential is applied to the body contact portion, the threshold voltage of the transistor increases compared to a situation where the body contact portion is floating. This phenomenon, unique to the switching transistor of the present invention, will be described in detail.

Figure 1:
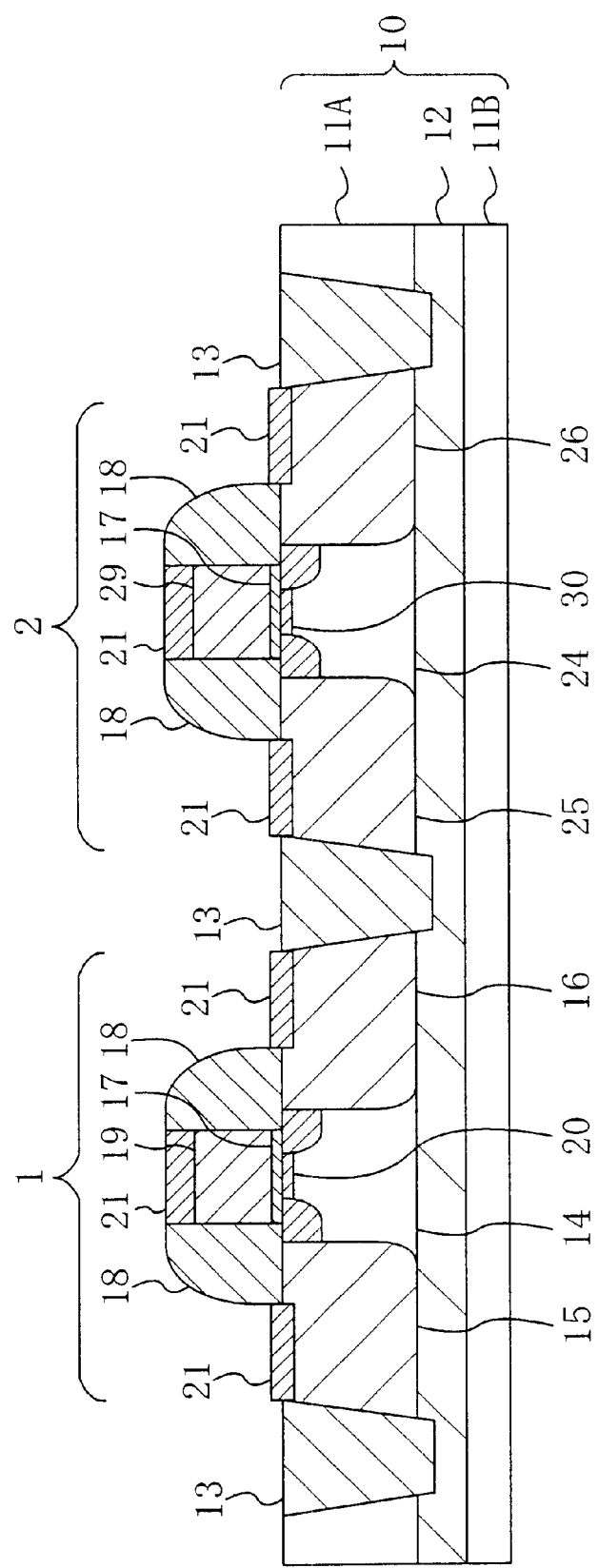
FIG. 1 is a cross-sectional view illustrating MOSFETs formed on an SOI substrate in a semiconductor integrated circuit according to the present invention.

FIG. 1 is a cross-sectional view illustrating MOSFETs formed on an SOI substrate in a semiconductor integrated circuit according to the present invention.

As shown in FIG. 1, an SOI substrate 10 is composed of upper silicon layer 11A, lower silicon layer 11B, and buried oxide (BOX) film 12 interposed between the upper and lower silicon layers 11A and 11B. Active regions, including NMOS and PMOS regions 1 and 2, are defined by an STI region 13 formed in the upper silicon layer 11A.

N-type source/drain regions 15 and 16 are formed in the NMOS region 1 of the upper silicon layer 11A with a p-well 14 interposed therebetween. A gate electrode 19 is formed over the p-well 14 with a gate insulating film 17 interposed therebetween and, a sidewall insulating film 18 is formed on the side faces of the gate electrode 19. In part of the p-well 14 below the gate insulating film 17, a p-type thresholdvoltage-setting doped layer 20 is defined between lightly doped drain (LDD) regions that extend from the n-type source/drain regions 15 and 16 inward, respectively.

Metal silicide 21 made of cobalt or nickel, for example, is deposited over the surfaces of the n-type source/drain regions 15 and 16 and gate electrode 19 to reduce the resistance of the transistor and the contact resistance.

On the other hand, p-type source/drain regions 25 and 26 are formed in the PMOS region 2 of the upper silicon layer 11A with an n-well 24 interposed therebetween. A gate electrode 29 is formed over the n-well 24 with a gate insulating film 17 interposed therebetween and a sidewall insulating film 18 is formed on the side faces of the gate electrode 29. In part of the n-well 24 below the gate insulating film 17, an n-type threshold-voltage-setting doped layer 30 is defined between LDD regions that extend from the p-type source/drain regions 25 and 26 inward, respectively.

As shown in FIG. 1, the bottom of the n-type source/drain regions 15 and 16 and p-type source/drain regions 25 and 26 is each in contact with the BOX film 12. Thus, the transistors can reduce their parasitic capacitance, thereby realizing high-speed operation. In this case, both NMOSFET and PMOSFET are partially-depletion-type transistors.

Even when predetermined voltages are applied to the n-type source/drain regions 15 and 16 and gate electrode 19 of the NMOSFET and the p-type source/drain regions 25 and 26 and gate electrode 29 of the PMOSFET so as to fix their potential levels, the p-well 14 of the NMOSFET and the n-well 24 of the PMOSFET are completely floating. This is because the wells 14 and 24 are electrically isolated from by the STI region 13 and BOX film 12. Accordingly, holes are stored in part of the p-well 14 near the n-type drain region 16, and electrons are stored in part of the n-well 24 near the p-type drain region 26. When a certain quantity of carriers are stored, the p- and n-wells 14 and 24 behave as if positive and negative voltages were applied to the p- and n-wells 14 and 24 respectively. As a result, the threshold voltage of each transistor drops, i.e., a so-called "body effect" occurs.

Next, a transistor structure designed to prevent the body effect that lowers the threshold voltage will be described with reference to FIG. 2.

Figure 2:
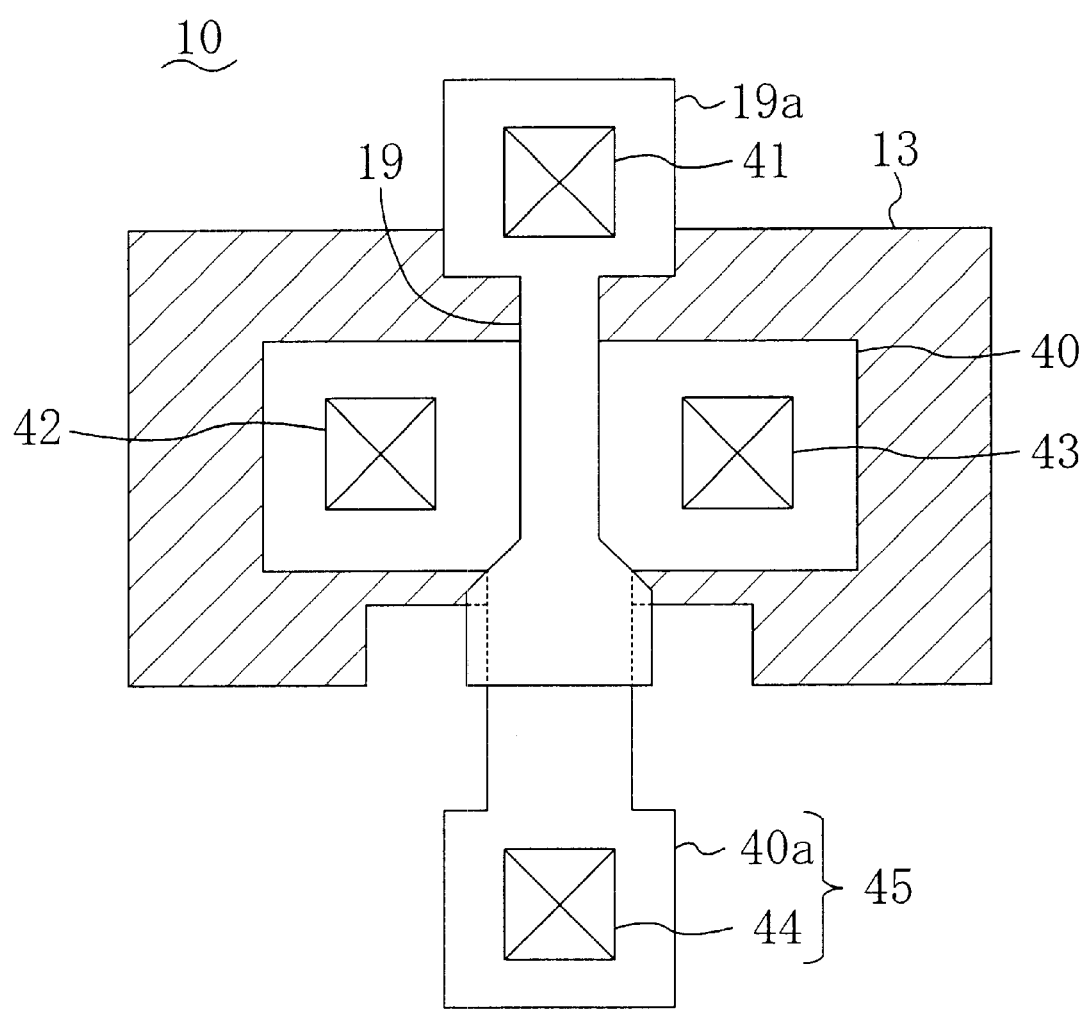
FIG. 2 is a plan view illustrating an MOSFET formed on an SOI substrate in the semiconductor integrated circuit of the present invention.

FIG. 2 illustrates a planar layout for the MOSFET formed on the SOI substrate in the semiconductor integrated circuit of the present invention.

As shown in FIG. 2, an active region 40, surrounded by the STI region 13 selectively formed, is defined in the SOI substrate 10. The gate electrode 19 is formed over the active region 40 and overlaps the active region 40. A gate electrode contact portion 19a is formed at one end of the gate electrode 19 in the gate width direction. A gate contact 41 is formed in the gate electrode contact portion 19a.

Source and drain contacts 42 and 43 are formed in the active region 40 with the gate electrode 19 interposed therebetween. An extended region 40a is formed by partially extending the active region 40 under the gate electrode 19 to the opposite side of the gate contact 41 in the gate width direction.

A body contact 44 is formed in the extended region 40a and a body contact portion 45 is made up of the extended region 40a and body contact 44. By fixing the body contact portion 45 at a predetermined potential level, the body effect can be minimized.

Hereinafter, the body effect and its minimization will be described with actually measured values shown in FIGS. 3A and 3B.

Figure 3A:
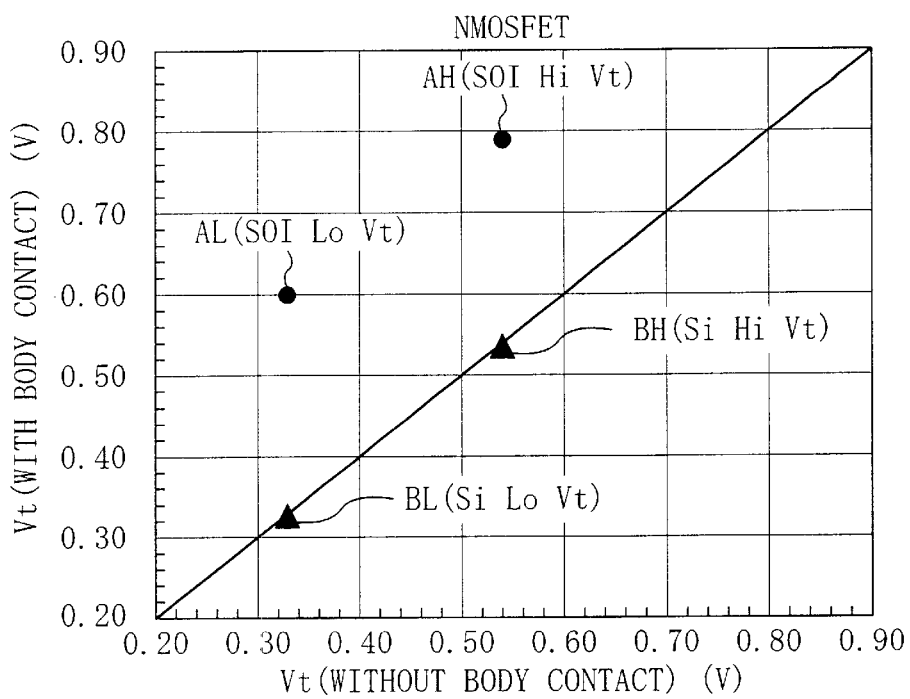
FIGS. 3A and 3B are graphs each illustrating a body-effect-induced variation in threshold voltage of a MOSFET formed on the SOI substrate compared to a MOSFET formed on a silicon substrate and illustrating characteristics of NMOSFETs and PMOSFETS, respectively.
Figure 3B:
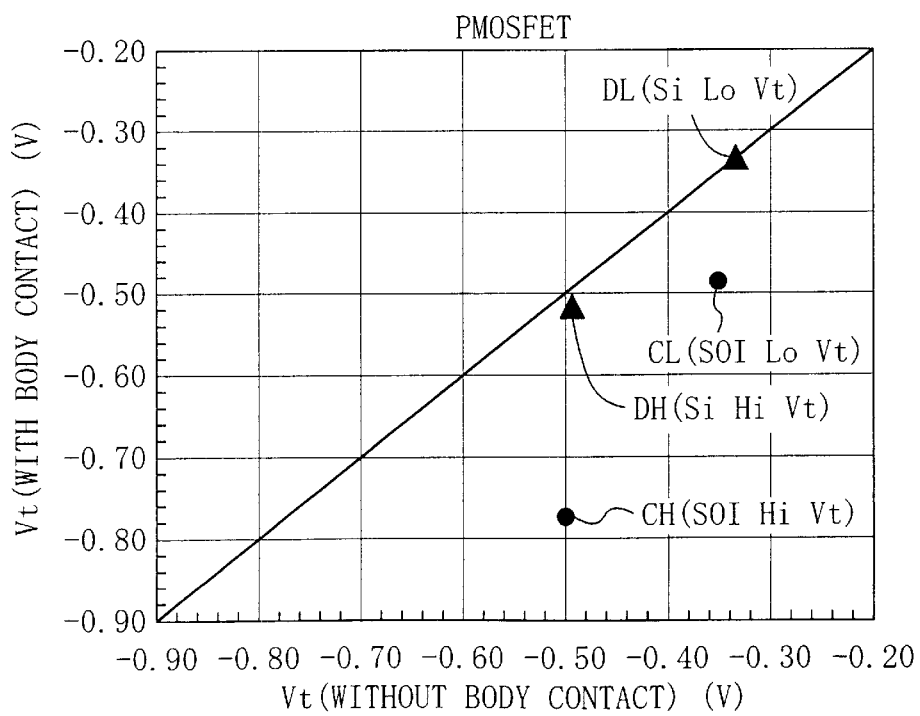

FIGS. 3A and 3B each illustrate how the threshold voltage of the transistors formed on an SOI substrate changes as compared to a transistor formed on a normal silicon substrate. Specifically, FIGS. 3A and 3B illustrate results obtained for NMOSFETs and PMOSFETs, respectively.

First, in FIG. 3A, AL and AH indicate low- and high-threshold-voltage transistors formed on the SOI substrate, respectively, and BL and BH indicate low- and high-threshold-voltage transistors formed on the silicon substrate, respectively. As can be seen from this graph, when the body contact portion 45 is grounded, for example, the threshold voltage of the low-threshold-voltage transistor AL on the SOI substrate increases from 0.33 V to 0.60 V. The threshold voltage of the high-threshold-voltage transistor AH also increases from 0.53 V to 0.79 V. That is to say, the threshold voltage increases by about 0.26 V in each of the transistors.

Next, in FIG. 3B, CL and CH indicate low- and high-threshold-voltage transistors formed on the SOI substrate, respectively, and DL and DH indicate low- and high-threshold-voltage transistors formed on the silicon substrate, respectively. When the body contact portion 45 is grounded, for example, the threshold voltage of the low-threshold-voltage transistor CL on the SOI substrate has its absolute value increased from 0.34 (−0.34 V) to 0.49 (−0.49 V). The threshold voltage of the high-threshold-voltage transistor CH also has its absolute value increased from 0.50 (−0.50 V) to 0.77 (−0.77 V). That is to say, the absolute value of the threshold voltage increases by 0.15 V to 0.27 V in each of the transistors.

On the other hand, in each of the low-threshold-voltage transistors BL and DL and high-threshold-voltage transistors BH and DH, the threshold voltage does not change no matter whether the body contact is grounded or not.

The present invention is characterized in that this body effect is positively utilized in forming a semiconductor integrated circuit.

Embodiment 1

Hereinafter, a first embodiment of the present invention will be described with reference to the drawings.

Figure 4A:
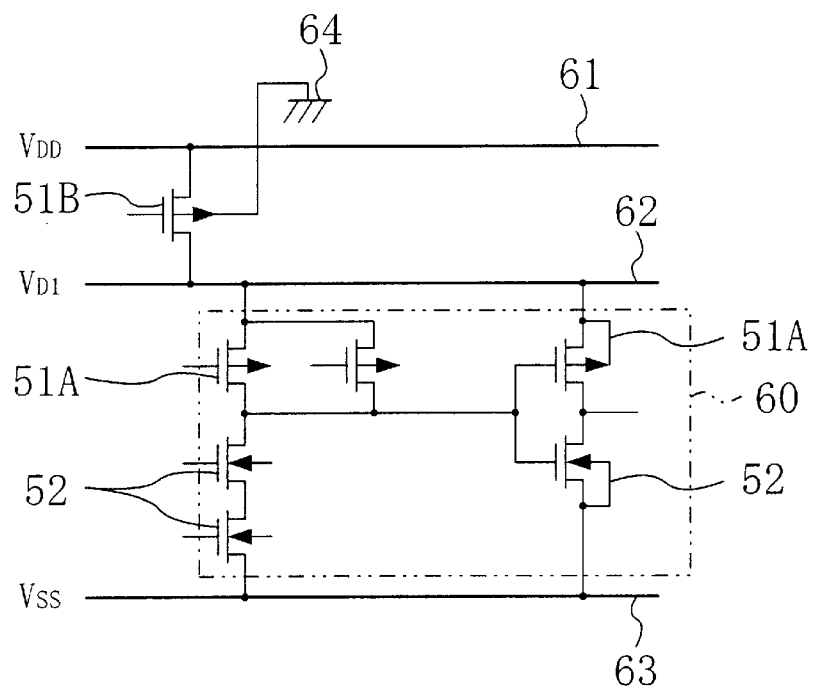
FIGS. 4A and 4B show a semiconductor integrated circuit according to a first embodiment of the present invention.
Figure 4B:
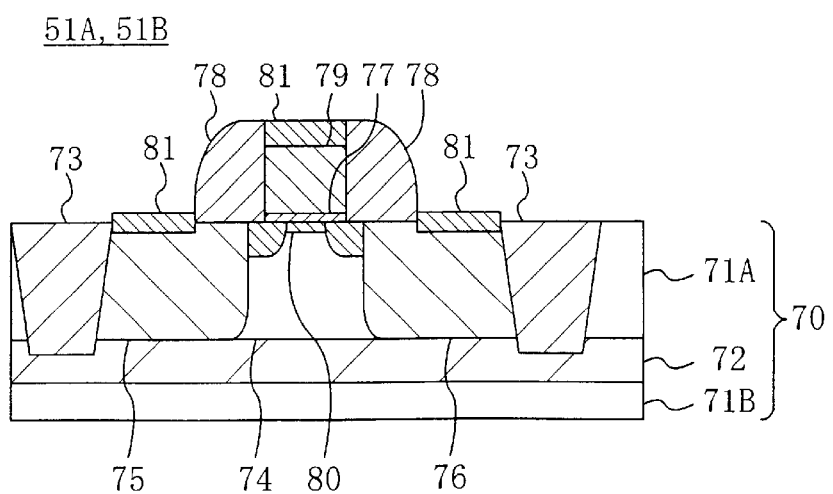

FIGS. 4A and 4B show an MTCMOS circuit as exemplary semiconductor integrated circuit according to the first embodiment of the present invention: FIG. 4A illustrates part of the circuit; and FIG. 4B illustrates a cross-sectional structure of an MOSFET included in the circuit.

As shown in FIG. 4A, the MTCMOS circuit is formed on an SOI substrate and includes a logic circuit section 60, a power line 61, an internal power line 62, and a ground line 63. 63. The logic circuit section 60 includes: p-channel transistors 51A for logical operations, each of which is implemented as a low-threshold-voltage transistor; and n-channel transistors 52 for logical operations. The power line 61 supplies a supply potential VDD. The internal power line 62 supplies an internal supply potential VD1 to the logic circuit section 60 via a switching transistor 51B implemented as a p-channel low-threshold-voltage transistor having a body contact portion. The ground line 63 supplies a ground potential Vss to the logic circuit section 60. In this circuit, the p-channel transistors 51A and switching transistor 51B are partially-depletion-type transistors with the same structure. The body contact portion of the switching transistor 51B is connected to a ground portion 64.

In addition, the threshold voltages of the p-channel transistors 51A and 51B are equal to each other, and the threshold voltages of the n-channel transistors 52 are also equal to each other.

FIG. 4B shows a structure for the p-channel transistors 51A and switching transistor 51B.

As illustrated in FIG. 4B, an SOI substrate 70 is composed of upper silicon layer 71A, lower silicon layer 71B, and BOX film 72 interposed between the upper and lower silicon layers 71A and 71B. A PMOSFET is formed in an active region that is defined by an STI region 73 formed in the upper silicon layer 71A.

P-type source/drain regions 75 and 76 are formed in the upper silicon layer 71A with an n-well 74 interposed therebetween. A gate electrode 79 is formed over the n-well 74 with a gate insulating film 77 interposed therebetween and a side-wall insulating film 78 is formed on the side faces of the gate electrode 79. In part of the n-well 74 below the gate insulating film 77, an n-type threshold-voltage-setting doped layer 80 is defined between LDD regions that extend from the p-type source/drain regions 75 and 76 inward, respectively.

Metal silicide 81 made of cobalt or nickel, for example, is deposited over the surfaces of the p-type source/drain regions 75 and 76 and gate electrode 79 to reduce the resistance of the transistor and the contact resistance.

Thus, in the MOS transistor of the first embodiment, the p-channel transistors 51A of the logic circuit section 60 and switching transistor 51B controlling the ON/OFF states of the logic circuit section 60 have the same structure, especially in the threshold-voltage-setting doped layer 80. As shown in FIG. 4A, the body contact portion of the switching transistor 51B is connected to the ground portion 64.

The body contact portion of the switching transistor 51B has the structure shown in FIG. 2. The p- and n-channel transistors 51A and 52 preferably do not have the body contact portions. However, when these transistors 51A and 52 do have the body contact portions, the body contact portions need to be electrically floating.

As described above, according to the first embodiment, the switching transistor 51B, which controls the operation of the logic circuit section 60, is implemented as a partially-depletion-type transistor including the SOI substrate 70 and having the body contact portion, and a ground potential is applied to the body contact portion. Thus, the threshold voltage of the switching transistor 51B has a large absolute value as shown in FIG. 3B, thereby reducing a leakage current when the circuit is in standby mode.

Further, none of the p- and n-channel transistors 51A and 52 in the logic circuit section 60 includes the body contact portion. Thus, their threshold voltages can be decreased and the circuit can be downsized and, at the same time, the high-speed operation and low power consumption are realized.

Moreover, as shown in FIG. 4B, the p-channel transistors 51A having a low threshold voltage and the switching transistor 51B having a high threshold voltage due to the existence of the body contact portion can be formed with a dopant with the same concentration introduced into channel regions. Thus, only one ion implantation process is needed to form the threshold-voltage-setting doped layer 80. As a result, the fabrication process of the circuit can be simplified, and the fabricating cost can be reduced although an expensive SOI substrate is used.

In the first embodiment, an MTCMOS circuit has been described as an example of a semiconductor integrated circuit. However, the present invention is not limited to this circuit. For example, when a plurality of logic circuit sections, e.g., one logic circuit section and another logic circuit section, are formed on a single SOI substrate, the switching transistor 51B implemented as the low-threshold-voltage transistor having the body contact portion according to this embodiment may be used as a switching device for selectively transferring the output data of one of the logic circuit sections to the other through a transmission line.

In this embodiment, the switching transistor 51B is implemented as a p-channel MOSFET, which is a low-threshold-voltage transistor when fabricated and gains a high threshold voltage when a predetermined potential is applied to its body contact portion. Alternatively, the switching transistor 51B may be implemented as an n-channel MOSFET. In this case, the n-channel switching transistor and n-channel transistors 52 should have the same structure.

A potential applied to the body contact portion of the switching transistor 51B is not limited to the ground potential Vss. Instead, any potential may be applied so long as the n-well 74 and p-type drain region 76 are reverse biased. For example, in a situation where a supply potential VDD is about 3.3 V, the potential applied to the body contact portion may be about 0 to −5 V when the switching transistor 51B is of n-channel-type and about 0 to 5 V when the switching transistor 51B is of p-channel-type.

Embodiment 2

Hereinafter, a second embodiment of the present invention will be described with reference to the drawings.

Figure 5A:
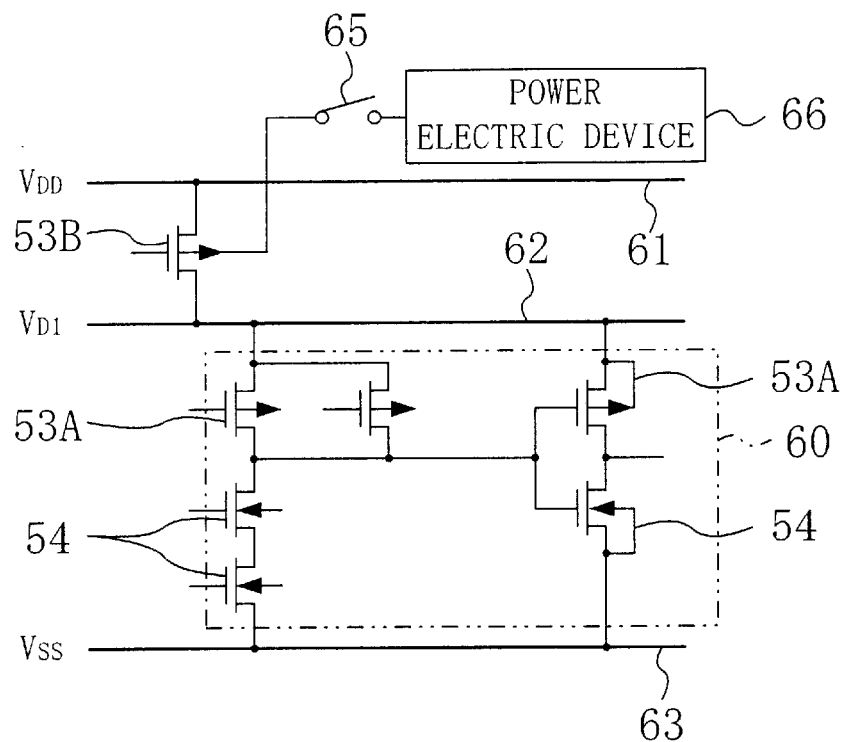
FIGS. 5A and 5B show a semiconductor integrated circuit according to a second embodiment of the present invention.
Figure 5B:
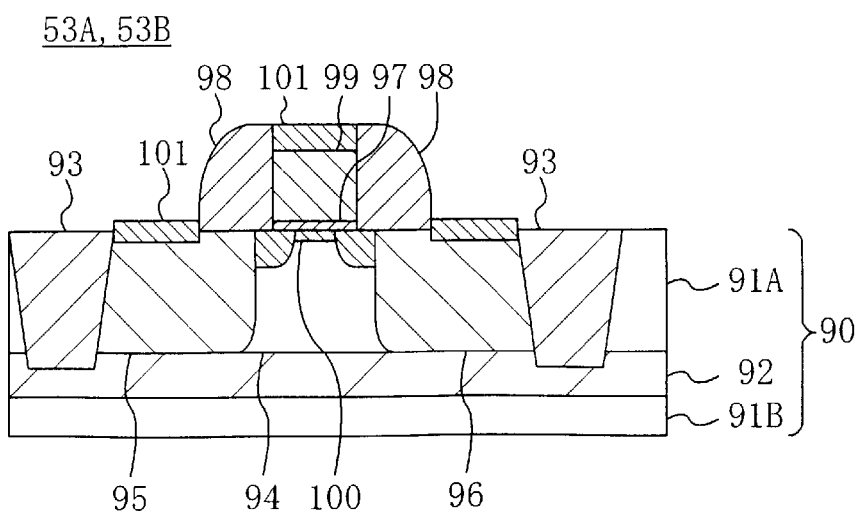
Figure 6:
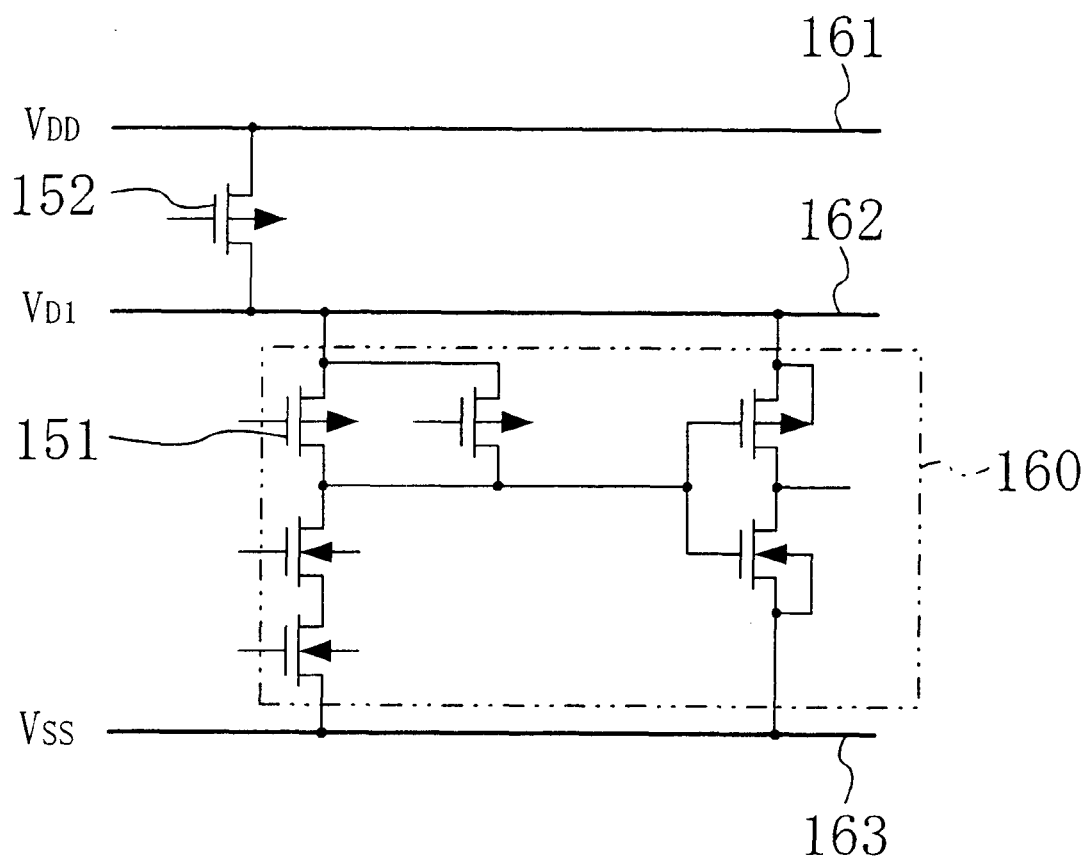
FIG. 6 illustrates a part of a known semiconductor integrated circuit.
Figure 7A:
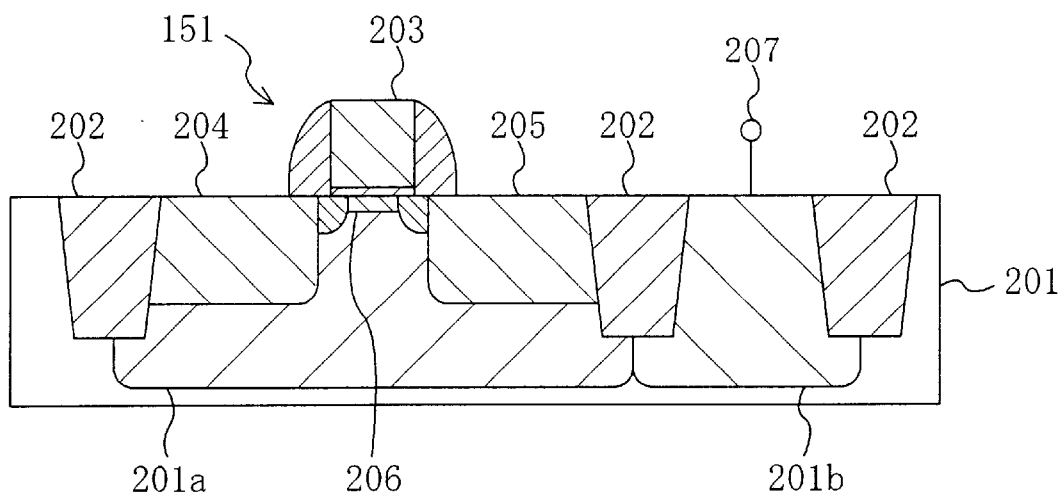
FIGS. 7A and 7B show a known semiconductor integrated circuit.
Figure 7B:
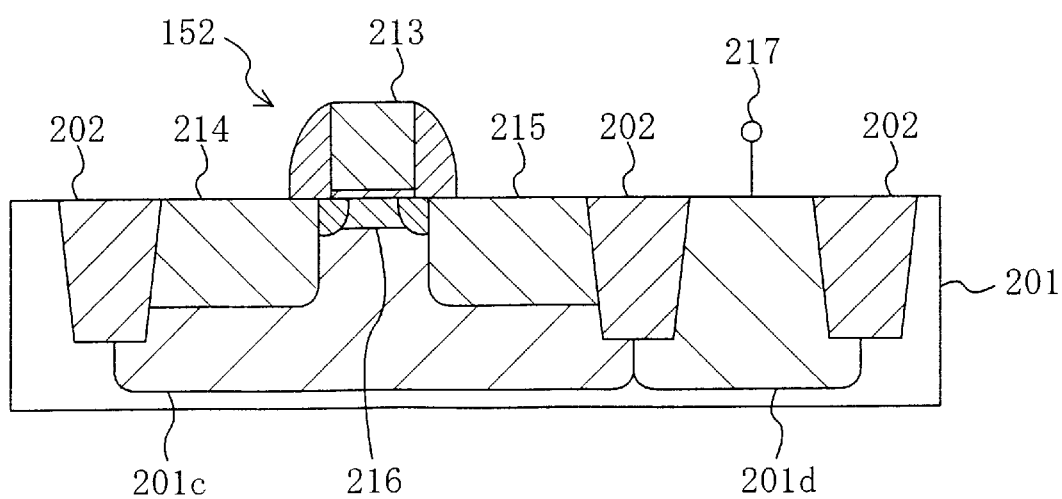

FIGS. 5A and 5B show an MTCMOS circuit as an exemplary semiconductor integrated circuit according to the second embodiment of the present invention: FIG. 5A illustrates part of the circuit; and FIG. 5B illustrates a cross-sectional structure of an MOSFET included in the circuit.

As shown in FIG. 5A, the MTCMOS circuit is formed on an SOI substrate and includes a logic circuit section 60, a power line 61, an internal power line 62, and a ground line 63. The logic circuit section 60 includes: p-channel transistors 53A for logical operations, each of which is implemented as a low-threshold-voltage transistor; and n-channel transistors 54 for logical operations. The power line 61 supplies a supply potential VDD. The internal power line 62 supplies an internal supply potential VD1 to the logic circuit section 60 via a switching transistor 53B implemented as a p-channel low-threshold-voltage transistor having a body contact portion. The ground line 63 supplies a ground potential Vss to the logic circuit section 60. In this circuit, the p-channel transistors 53A and switching transistor 53B are partially-depletion-type transistors with the same structure. The body contact portion of the switching transistor 53B is connected to a power electronic device 66, which is a power supplying means, via a switch 65. In addition, the threshold voltages of the p-channel transistors 53A and 53B are equal to each other, and the threshold voltages of the n-channel transistors 54 are also equal to each other.

In a situation where a supply potential VDD of e.g., about 3.3 V is applied to the body contact portion of the switching transistor 53B, the power electric device 60 may have an output voltage of about 0 to −5 V when the switching transistor 53B is of n-channel-type or about 0 to 5 V when the switching transistor 53B is of p-channel-type. This output voltage may be either fixed or changeable.

FIG. 5B shows a structure for the p-channel transistors 53A and switching transistor 53B.

As illustrated in FIG. 5B, an SOI substrate 90 is composed of upper silicon layer 91A, lower silicon layer 91B, and BOX film 92 interposed between the upper and lower silicon layers 91A and 91B. A PMOSFET is formed in an active region that is defined by an STI region 93 formed in the upper silicon layer 91A.

P-type source/drain regions 95 and 96 are formed in the upper silicon layer 91A with an n-well 94 interposed therebetween. A gate electrode 99 is formed over the n-well 94 with a gate insulating film 97 interposed therebetween and a side-wall insulating film 98 is formed on the side faces of the gate electrode 99. In part of the n-well 94 below the gate insulating film 97, an n-type threshold-voltage-setting doped layer 100 is defined between LDD regions.

Metal silicide 101 made of cobalt or nickel, for example, is deposited over the surfaces of the p-type source/drain regions 95 and 96 and gate electrode 99 to reduce the resistance of the transistor and the contact resistance.

The body contact portion of the switching transistor 53B has the structure shown in FIG. 2. The p- and n-channel transistors 53A and 54 preferably do not have the body contact portions. However, when these transistors 53A and 54 do have the body contact portions, the body contact portions need to be electrically floating.

As described above, according to the second embodiment, the switching transistor 53B, which controls the operation of the logic circuit section 60, is implemented as a partially-depletion-type transistor including the SOI substrate 70 and having the body contact portion. In addition, a potential may be selectively applied to the body contact, depending on the mode of operation of the circuit.

Accordingly, if a predetermined potential is applied to the body contact portion when the circuit is in standby mode, the threshold voltage of the switching transistor 53B can have a large absolute value as shown in FIG. 3B. As a result, the leakage current can be reduced during the standby mode.

On the other hand, when the circuit is operating, the switch 65 between the switching transistor 53B and power electric device 66 is turned OFF so that the body contact portion of the switching transistor 53B is electrically floating. Then, the threshold voltage of the switching transistor 53B has a small absolute value, which is equal to that of the transistors 53A included in the logic circuit section 60. As a result, the switching transistor 53B much less likely causes a voltage drop. Thus, the internal supply potential VD1 hardly decreases compared to the supply potential VDD and, it is possible to prevent the operating speed of the logic circuit section 60 from decreasing.

As in the first embodiment, the p-channel transistors 53A having a low threshold voltage and the switching transistor 53B having a changeable threshold voltage can be formed with a dopant with the same concentration introduced into the channel regions. Thus, only one ion implantation process is needed to form the threshold-voltage-setting doped layer 100. As a result, the fabrication process of the circuit can be simplified, and the fabricating cost can be reduced although an expensive SOI substrate is used.

In the second embodiment, an MTCMOS circuit has also been described as an example of a semiconductor integrated circuit. Naturally, the present invention is not limited to this circuit. For example, when a plurality of logic circuit sections, e.g., one logic circuit section and another logic circuit section, are formed on a single SOI substrate, the switching transistor 53B implemented as the low-threshold-voltage transistor having the body contact portion according to this embodiment may be used as a switching device for selectively transferring the output data of one of the logic circuit sections to the other through a transmission line.

In the second embodiment, the switching transistor 53B is implemented as a p-channel MOSFET, which is a low-threshold-voltage transistor when fabricated and gains a high threshold voltage when a predetermined potential is applied to its body contact portion. Alternatively, the switching transistor 53B may be implemented as an n-channel MOSFET. In that case, the n-channel switching transistor and n-channel transistors 54 should have the same structure.

In the first and second embodiments, the low-threshold-voltage transistors 51A, 52, 53A, and 54 included in the logic circuit section 60 may be implemented as fully-depletion-type transistors. Even so, the switching transistors 51B and 53B need to be partially-depletion-type transistors. This is because if the transistors 51B and 53B were fully-depletion-type transistors, depletion layers would expand and cover the entire n-wells 74 and 94 and the potential of the substrate could not be fixed by the body contact.

What is claimed is:

1. A semiconductor integrated circuit comprising:
   a logic circuit section including transistors for logical operations formed on an SOI substrate;
   a switching transistor, which is formed on the SOI substrate for controlling ON/OFF states of the logic circuit section and which has a body contact portion;
   a first power line that supply potential to the switching transistor;
   a second power line that supplies potential to the logic circuit section via the switching transistor; and
   a third power line that supplies a ground potential to the logic circuit section,
   wherein a threshold-voltage-setting doped layer of the transistors, for logical operation and a threshold-voltage-setting doped layer of the switching transistor have a same diffusion depth, and
   wherein the body contact portion of the switching transistor is connected to a ground portion, wherein a potential of wells in channels of the transistors for logical operations is electrically floating.

2. The device of claim 1, wherein the switching transistor includes: an active region formed in the SOI substrate; and a gate electrode formed to overlap the active region, wherein the body contact portion is formed in an extended region that has been formed by extending part of the active region under the gate electrode along the width of the gate electrode.

3. A semiconductor integrated circuit comprising:
   a logic circuit section including transistors for logical operations fanned on an SOI substrate;
   a switching transistor, which is formed on the SOI substrate for controlling ON/OFF states of the logic circuit section and which has a body contact portion;
   a first power line that supplies a supply potential to the switching transistor;
   a second power line that supplies the supply potential to the logic circuit section via the switching transistor; and
   a third power line that supplies a ground potential to the logic circuit section,
   wherein a threshold-voltage-setting doped layer of the transistors for logical operation and a threshold-voltage-setting doped layer of the switching transistor have a same diffusion depth, and
   wherein the body contact portion of the switching transistor is connected to power supply means via a switch, wherein a potential of wells in channels of the transistors for logical operations is electrically floating.

4. The device of claim 3, wherein the switching transistor includes: an active region formed in the SOI substrate; and a gate electrode formed to overlap the active region, wherein the body contact portion is formed in an extended region that has been formed by extending part of the active region under the gate electrode along the width of the gate electrode.

5. The device of claim 1, wherein the transistors for logical operations and the switching transistor is of a partially-depletion-type transistor having a same channel concentration.

6. The device of claim 3, wherein the transistors for logical operations and the switching transistor is of a partially-depletion-type transistor having a same channel concentration.

7. The device of claim 3, wherein the power supply means supplies a predetermined potential to the body contact portion when the logic circuit section is in standby mode and allows the body contact portion to be electrically floating when the logic circuit section is operating.

8. The device of claim 1, wherein the switching transistor has a threshold voltage, which is substantially equal to that of the transistors for logical operations when no potential is applied to the body contact portion and which is higher than that of the transistors for logical operations when a potential is applied to the body contact portion.

9. The device of claim 3, wherein the switching transistor has a threshold voltage, which is substantially equal to that of the transistors for logical operations when no potential is applied to the body contact portion by the power supply means and which is higher than that of the transistors for logical operations when a potential is applied to the body contact portion by the power supply means.

* * * * *